United States Patent [19]

Ishii et al.

[11] Patent Number: 4,908,495
[45] Date of Patent: Mar. 13, 1990

[54] HEATING LAMP ASSEMBLY FOR CCVD REACTORS

[75] Inventors: Kaoru Ishii; Thomas F. Wilkinson, both of Garland; Stephen J. Dwyer, Dallas; Rick Cooper, Farmers Branch, all of Tex.

[73] Assignee: Texas Instruments Incorporated, Dallas, Tex.

[21] Appl. No.: 287,747

[22] Filed: Dec. 20, 1988

[51] Int. Cl.$^4$ .................... H05B 1/00; F21V 29/00; G02B 5/10
[52] U.S. Cl. .................... 219/343; 118/50.1; 118/641; 219/347; 219/405; 350/610
[58] Field of Search ............ 219/347, 354, 343, 349, 219/350, 351, 352, 405, 411; 118/50.1, 641, 642, 724, 729; 350/610

[56] References Cited

U.S. PATENT DOCUMENTS

| | | |
|---|---|---|
| 3,240,915 | 3/1966 | Carter et al. .................. 219/405 |
| 3,861,787 | 1/1975 | Locke et al. .................. 350/610 |
| 3,862,397 | 1/1975 | Anderson et al. ............... 219/405 |
| 3,966,308 | 6/1976 | Nilson ........................ 219/343 |
| 4,048,955 | 9/1977 | Anderson ...................... 219/405 |
| 4,101,759 | 7/1978 | Anthony et al. ................ 219/354 |
| 4,266,857 | 5/1981 | Svenson ....................... 350/610 |
| 4,443,059 | 4/1984 | Wells ......................... 350/610 |
| 4,503,807 | 3/1985 | Nakayama et al. ............... 219/411 |
| 4,558,660 | 12/1985 | Nishizawa et al. ............. 219/411 |

Primary Examiner—A. D. Pellinen
Assistant Examiner—Geoffrey S. Evans
Attorney, Agent, or Firm—Gary C. Honeycutt; Melvin Sharp; N. Rhys Merrett

[57] ABSTRACT

A heating lamp assembly for use with semiconductor reactors has a reflector assembly constructed of tubes joined together by heat conductive spacers to provide for water cooling of the reflector assembly, has mounting pins for providing variable spacing of heating lamps, and water manifolds on each side of the reflector assembly for directing water through the cooling tubes. One or more blocking gates are mounted on the lamp mounting pins to direct cooling air flow across the heating lamps.

19 Claims, 5 Drawing Sheets

HEATING LAMP ASSEMBLY FOR CCVD REACTORS

FIELD OF THE INVENTION

This invention relates to continuous chemical vapor deposition reactors, and more particularly to improvements in heating lamp assemblies for such reactors.

BACKGROUND OF THE INVENTION

A continuous chemical deposition reactor may be a standalone process system with a continuous semiconductor wafer flow. Basic subsystems in such a system may include a wafer handling, a reaction chamber, a gas flow system, a cooling system, and an electrical system.

The wafer handling system may include wafer loaders and unloaders, wafer carriers, and a track for moving a wafer through the reactor chambers.

The reactor chamber subsystem is the site for processing the semiconductor wafer. Each chamber may include a gas supply inlet, a chamber housing, heat lamps and exhaust.

The gas flow subsystem supplies the reactant gases to each chamber, and may include valves, flow controllers and an exhaust system.

The cooling subsystem assists in maintaining the process temperature and reduces the heat radiation to the surrounding components. Both air flow and water flow may be used in the cooling subsystem.

The electrical subsystem provides subsystem control and powers the reactor, and may include power supplies, motors, sensors, valves, and one or more computer/controller.

A basic reactor and process may be as follows. A semiconductor wafer is loaded onto a carrier which enters one end of the reactor through a port and is moved successively through the various chambers and out the other end of the reactor through another port. The reactor may not be physically closed but has gas seals at each end and in between each chamber of the reactor. As an example, a reactor may include eight chambers in which the first chamber consists of a nitrogen seal, the second chamber is a preheat chamber, the next four chambers may be deposition chambers, then a cool-down chamber and the last chamber is a nitrogen seal.

A heating lamp assembly is positioned over each reactor chamber to supply the heat to raise the reactor chamber to the temperature necessary for the process to be performed in the chamber. The heating assembly generates a large amount of heat, which heat, while heating the reaction chamber must be removed from the heating assembly to prevent damage to the assembly.

An example of a prior art continuous chemical vapor deposition reactor may be found in U. S. Pat. No. 4,048,955.

SUMMARY OF THE INVENTION

The invention relates to a high temperature heating assembly and its structure which permits a uniform transfer of heat to the reactor chamber, at the same time removing the heat from the heating assembly.

The heating for a reaction chamber is provide by incandescent lamps that are air cooled and are arranged in a row of lamps, up to 16 in number, and arranged with the length of the lamps perpendicular to the movement of the semiconductor carriers traveling in the reactor chambers.

A highly polished metal surface is used to reflect heat and light into the reactor chamber. The polished metal surface is above the lamp filaments. Cool air is directed around the lamps to help cool them. Water is directed through the reflector structure to carry heat away from the reflector and reflector structure.

The etch and deposition process in the reactor depends upon gas flow through the reactor and the reaction temperature created by the heating assembly.

The heat lamp reflector is made up of brazed tubes and spacers between each tube. A coolant in passed through the tubes to transfer heat away from the reflector. The temperature, less than one-half inch from the reflector, is as high as 1150 decree C.

Infrared radiation from the heat lamps must be reflected or removed from the reflector as quickly and as efficiently as possible to reduce power consumption. Since the reflector will melt at approximately 500° C., to remove the heat, the reflector must be water cooled. Solid metal spacers may be placed between the cooling tubes of the reflector to transfer heat to the water coolant.

A water manifold is positioned along the ends of the reflector tubes to transfer water through the tubes. The tubes may be brazed to the water manifold block.

To provide uniform heating or distribute heat in a desired pattern to the reactor chamber below the heating lamp assembly, variable spacing mounts for the heating lamps are provided. Spacing-mounting pins are arranged along opposites edges of the lamp assembly, and the lamp ends are mounted between the pins. Since the pins are uniformly spaced along each mounting edge, the position and spacing of the lamps may be varied to provide a desired heating pattern to the reactor.

Also by using the lamp spacing pins, blocking "gates" may be used to direct air flow along the tubes to assist in cooling the tubes and the reflector assembly.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT OF THE INVENTION

Figure 1:
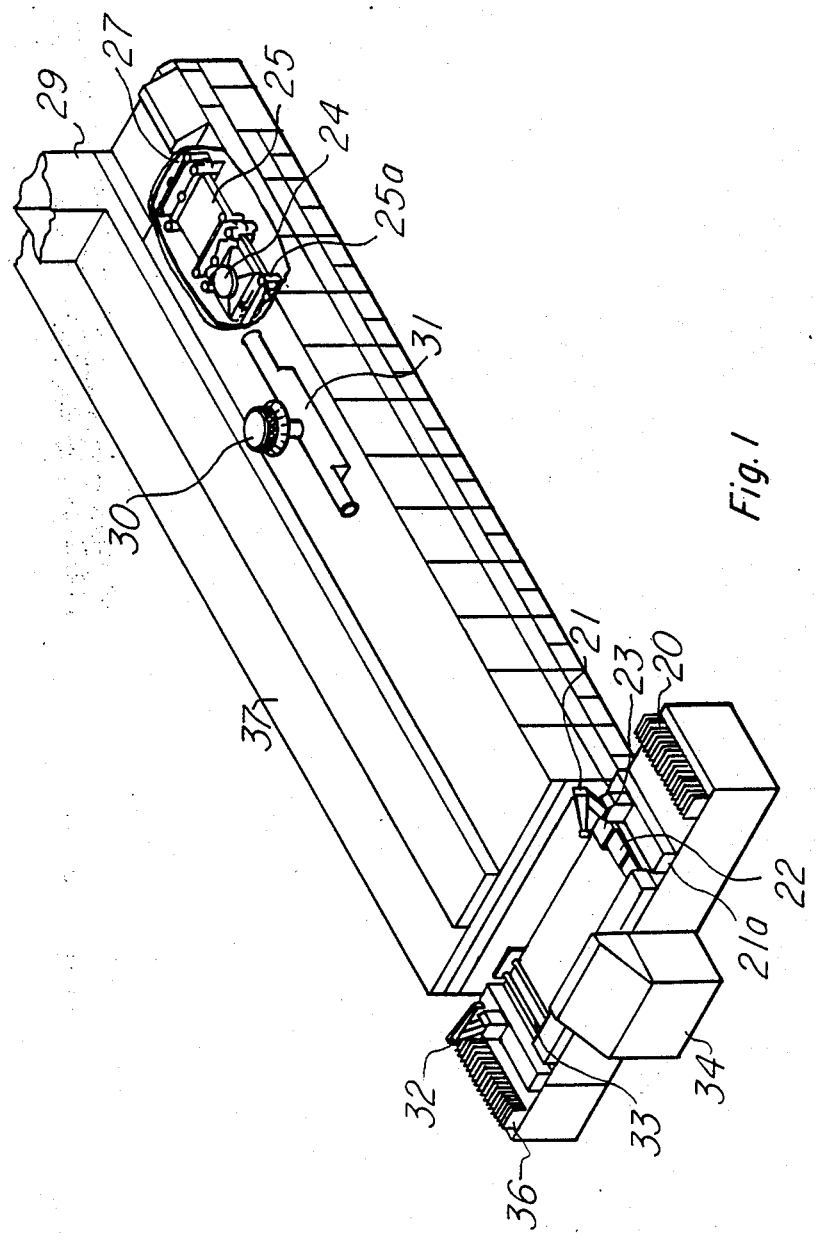
FIG. 1 illustrate a continuous chemical vapor deposition reactor utilizing the heater assembly of the present invention.

FIG. 1 illustrates a continuous chemical vapor deposition reactor in which the heat assembly of the present invention is used. A plurality of wafer cassettes 20 are located along and adjacent to a robotic arm 21 which moves along track 21a. The track allows the robotic arm 21 to move adjacent each of a plurality of wafer cassettes so as to permit the robotic arm to access each wafer in each cassette. The robotic arm lifts a wafer from a cassette and places it in a carrier 22 at the entrance to the reactor. The entrance to the reactor is a seal-joint to prevent gases in the reactor from exiting from the reactor.

At the entrance, and before the susceptor enters the reactor, a vacuum pick-up arm lifts the lid from the susceptor to allow the robotic arm to place a semiconductor wafer into the carrier. After the semiconductor is placed into the carrier, the carrier lid is replace and the susceptor is indexed through the reactor and the plurality of chambers that make up the reactor.

The carrier is indexed through the reactor and chambers using the length of the carrier and at least one spacer bar between each carrier. As each carrier is indexed into the reactor, each preceding carrier is moved to the next reactor chamber. The indexing is continuous, and as the carrier exits from the last reaction chamber, it moves indexed through the return path of the reactor to the exit opening in the reactor, where the lid of the carrier is removed by the return lid pick-up 33. A robotic arm 32 mounted on track 32a removes the semiconductor wafer and places it in a wafer cassette 36.

The reactor is divided into a plurality of quartz reactor chambers 25. The reaction chambers 25 are joined by a junction 25a through which is introduced the process gases and from which the used gases are exhausted. Positioned over each reaction chamber is a heater block 24, used to heat the reaction chamber to a desired temperature.

Each junction 25a has at least one exhaust tube 27 for removing exhaust gases from the reaction chambers. The exhaust gases are directed through a burn-off tube 31 to the gas burner 30.

The entire reactor is shrouded in an enclosure 37, and an air duct 29 is provided to circulate and exhaust gas-/air from inside the system shroud.

Figure 2:
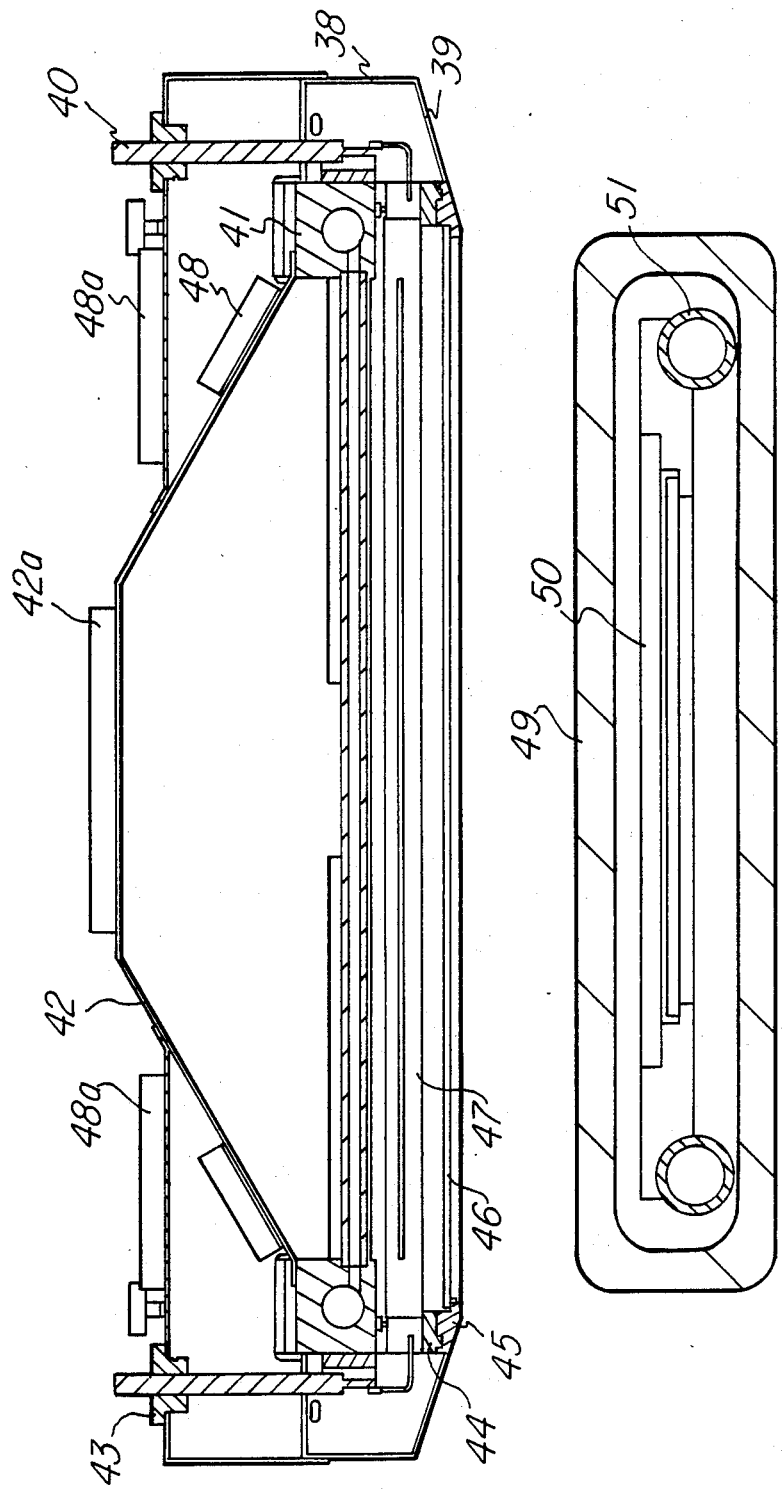
FIG. 2 illustrates a heating assembly positioned over a reaction chamber.
Figure 3:
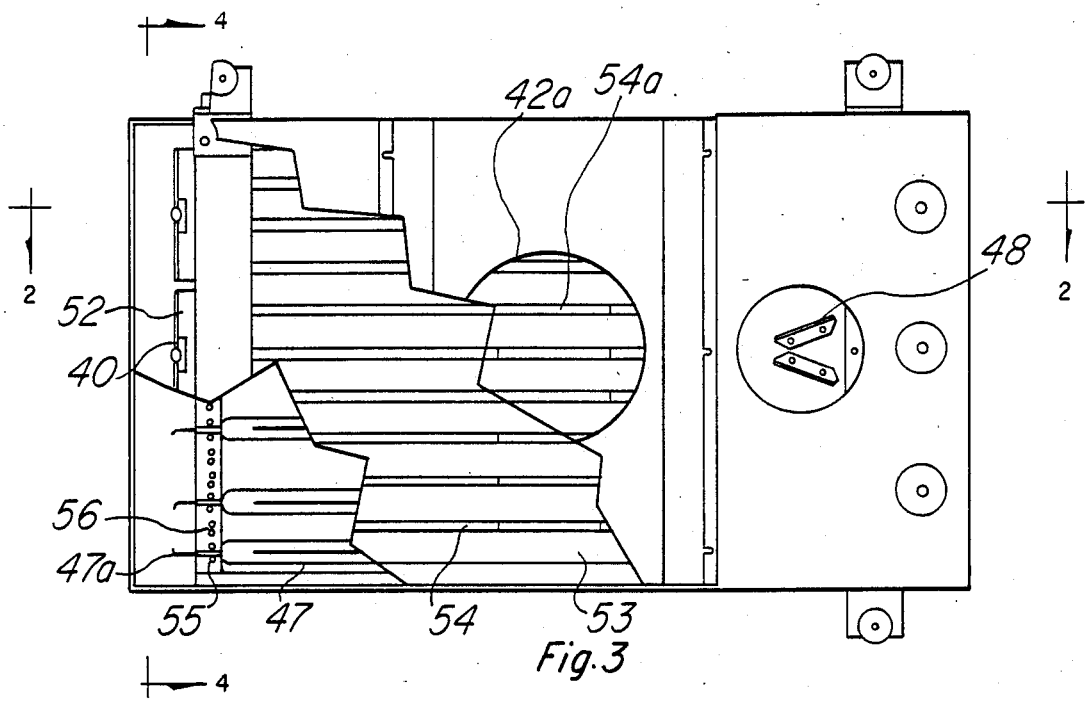
FIG. 3 illustrates a top view of the heating assembly with cut-away section to show the heater reflector assembly and heating tubes.

FIG. 2 is a cross sectional view of a heating lamp assembly positioned over a reactor chamber, taken through section 2—2 of FIG. 3. The lamp assembly includes a housing 42 and a hood 42a. A reflector manifold is used for inputting water cooling though the assembly. Lamp 47 is mounted on each end by wires 47a attached to a bus bar 40, which extends through insulator 43 to a point outside the lamp housing. In insulator 40 and retainer 45 hold a quartz shield over the lamps in between the lamps and chamber.

There are two air inlets 48a positioned over two deflectors 48 on two sides of the lamp housing 42 which direct air flow though the lamp housing for cooling purposes. Two air inlets are used to provide maximum air flow to the two lamp mounting ends of the housing where there is a maximum of heat build-up. The air is input from the two side of the top of the housing and directed around the ends of the lamp, through the lamp mounting pins (see FIG. 4), across the lamps and reflector above the lamps. The air exits through openings in the center of the reflector (see FIG. 3) and through the hood 42a at the top of the heating lamp assembly.

The lamp housing 38 is angled at 39 to minimize the heating of the housing. The temperature of this part of the housing is significantly reduce by angling the corner.

The reactor chamber is spaced below the heating assembly is made up basically of a quartz housing, tracks 51 on which carrier 50 is moved through the reactor. Heat from the heating assembly heats the reactor and the semiconductor device (hot illustrated) in carrier 50 to the desired processing temperature.

FIG. 3 is a top view of the heating assembly with parts removed to show the construction and functional parts of the heating assembly. The housing is shown cut away to show the reflector tubes 53 and reflector spacers 54. Heating lamps 47 are illustrated with the end of the lamp positioned between a pair of mounting posts 55. The connection wire 47a of lamp 47 extends through an insulator and connects to a bus bar 40 mounted on insulator 52. Air is directed through deflectors 48, around the ends of the lamps, across the lamps, and flows up through openings 54a in the reflector. The upward flow of air through openings 54a exits the lamp assembly through hood 42a.

Figure 4:
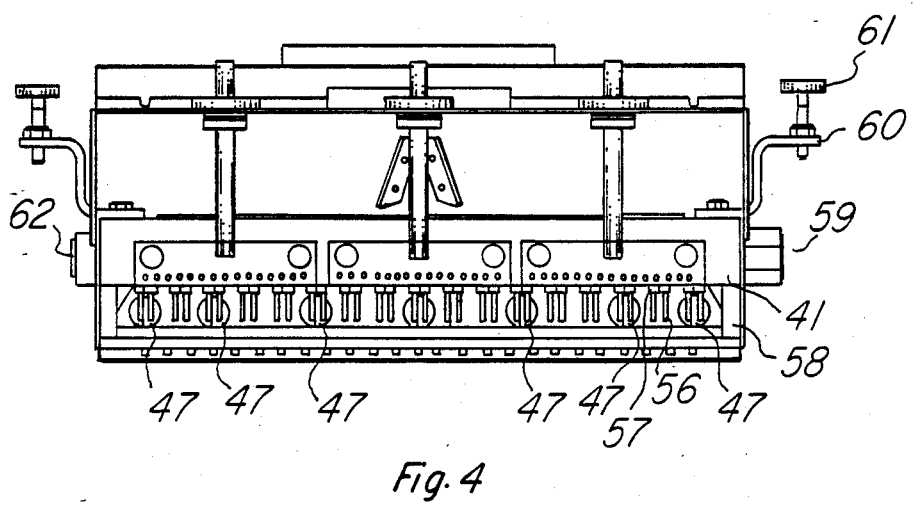
FIG. 4 is a cross-sectional view through section 4—4 of FIG. 3.

FIG. 4 is a cross-sectional view of the heating assembly taken though section 4—4 of FIG. 3. Illustrated is the mounting post 56 and spacers 57 on which the ends of the lamps are mounted. An array of mounting pins are arranged across the end of the heating assembly to permit variable spacing of the lamps.

A water inlet 59 is shown, through which water is introduced into the reflector for cooling the reflector. The reflector manifold is shown at 41 and a water outlet is shown at 62.

The lamp assembly is supported by support bracket 60, and secured thereto by threaded knob 61. Another view of air deflector is show at 18.

Figure 5:
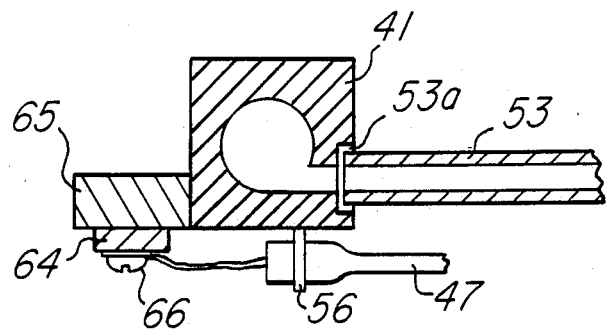
FIG. 5 illustrates the water flow for cooling the heater reflector.

FIG. 5 is a simplified diagram illustrating the water manifold 41, reflector tubes 53 and the lamps 47. The reflector tubes 53 are braised to the water manifold 41 at 53a. Water flows the manifold and into the reflector tubes as indicated by the arrow. Water flow is continuous though the reflector during operation of the rector, or while the heating lamps are on to keep the heating reflector and heating assembly to a desired temperature. Lamp 47 is mounted with mounting pins 56 and attached to a power bus 64 by screw 66. The power bus is mounted on insulating block 65.

Figure 6:
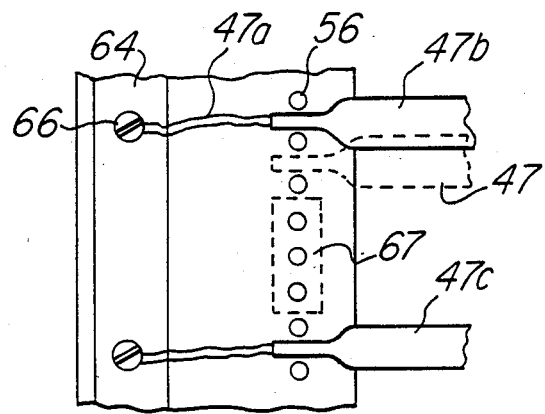
FIG. 6 illustrates the pin configuration that allows variable heat lamp spacing.

FIG. 6 is a simplified drawing of the variable mounting of the heat lamps by using an array of pins. Two lamps 47b and 47c are shown mounted in mounting pins 56. A lamps 47d, indicated by dashed lines, is shown to indicate a different mounting position for lamp 47b. The power wires 47a for the lamps are connected power bus 64 by screws 66.

The air flow around the lamps may be adjusted by using blocking gates 67, to force air flow across the lamps, and blocking air flow between the lamps, and to spaces where no lamps are mounted. The lamps may be spaced on any increment of the mounting pins to supply a desired heat distribution pattern to a reactor chamber mounted below the lamps.

Figure 7:
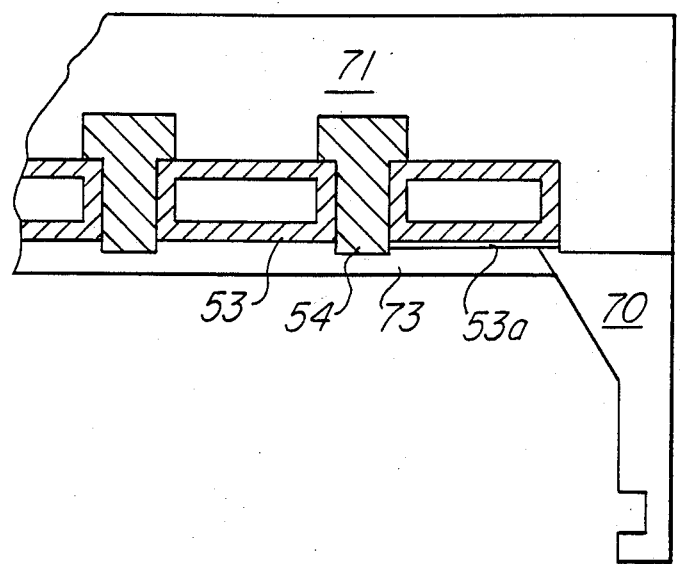
FIG. 7 illustrates the lamp reflector construction using tubes and spacer.

FIG. 7 is a simplified illustration of the lamp reflector. Reflector tubes 53 are tubes having a rectangular cross section to provide a large water passage for cooling water to remove excess heat from the heating lamps. The tubes are joined together with metal spacers to provide a large bulk to absorb that transfer heat to the reflector tubes 53 and the cooling water therein.

The spacers 54 and tubes 53 are brazed together to provide for the maximum heat transfer between the tubes 53 and the spacers 54. The reflector tube assembly is mounted to the reflector housing assembly by mounting supports 70 and 71. Supports 70 and 71 are solid metal and brazed together to help increase the thermal conductivity of the supports. If the supports 70 and 71 were not brazed the temperature transfer from the supports to the cooling tubes 53 would not be sufficient to prevent possible melting of the support structure. The surface 73 of the reflector is plated to provide a reflective surface. Slot 72 is used for mounting a quarts shield.

The end tubes, designated as 53a, FIG. 7, have a higher water flow than the other tubes since the heat build-up is greater at the end of the reflector where the ends of the heat lamps are mounted.

Figure 8:
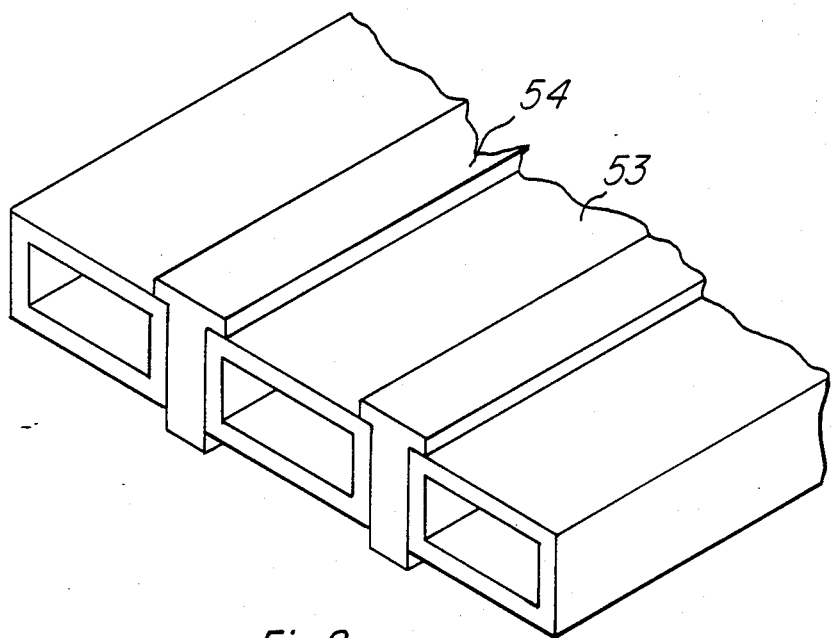
FIG. 8 is an isometric drawing to illustrate the reflector construction.

FIG. 8 illustrates the shield structure provided by the rectangular tubes 53 and the spaces 54 brazed to and holding the rectangular tubes together.

What is claimed:

1. A heating lamp assembly for use with semiconductor reactors comprising:
   a housing;
   a reflector assembly within said housing;
   a plurality of cooling tubes within said reflector assembly for cooling said reflector assembly;
   a plurality of heat conductive spacers joining said tubes together;
   heat lamp mounting assemblies on two sides of said reflector assembly;
   and at least one heating lamp secured to said heat lamp mounting assemblies.

2. The heating lamp assembly according to claim 1, wherein said housing has deflector devices on at two sides of said housing for directing air though the heating lamp assembly.

3. The heating lamp assembly according to claim 1, wherein said mounting assemblies comprise a plurality of mounting pins between which the ends of the heating lamps are mounted.

4. The heating lamp assembly according to claim 3, wherein the heating lamps are mounted with the mounting pins to vary the spacing between or position of the heating lamps.

5. The heating lamp assembly according to claim 1, wherein the plurality of tubes and spacers are joined together by brazing.

6. The heating lamp assembly according to claim 5, wherein said heating lamp assembly has a reflecting surface, and said spacers are solid metal to conduct heat from the reflecting surface to the cooling tubes.

7. The heating lamp assembly according to claim 6, wherein the surface of the reflecting surface is plated to provide a reflective surface.

8. A heating lamp assembly for use with semiconductor reactors comprising:
   a housing;
   a reflector assembly within said housing;
   water manifolds joined to a plurality of cooling tubes within said reflector assembly for allowing cooling water to flow through said reflector assembly;
   a plurality of heat conductive spacers joining said tubes together;
   heat lamp mounting assemblies on two sides under said reflector assembly;
   and at least one heating lamp secured to said heat lamp mounting assemblies adjacent the reflector assembly.

9. The heating lamp assembly according to claim 8, wherein said housing has deflector devices on at two sides of said housing for directing air though the heating lamp assembly.

10. The heating lamp assembly according to claim 8, wherein said mounting assemblies comprise a plurality of mounting pins between which the ends of the heating lamps are mounted.

11. The heating lamp assembly according to claim 10, including a plurality of heating lamps mounted with the mounting pins to vary the spacing between position of the heating lamps.

12. The heating lamp assembly according to claim 8, wherein said heating lamp assembly ha a reflecting surface, and said spacers are solid metal to conduct heat from the reflecting surface to the cooling tubes.

13. The heating lamp assembly according to claim 12, wherein the surface of the reflecting surface is plated to provide a reflective surface.

14. The heating lamp assembly according to claim 10, including one or more blocking gates mounted on the lamp mounting pins to direct cooling air flow across the heating lamps.

15. A heating lamp assembly for use with semiconductor reactors comprising:
   a housing;
   a reflector assembly within said housing;
   water manifolds joined to two ends of said reflector assembly for allowing cooling water to flow through said reflector assembly;
   heat lamp mounting assembles on two sides under said reflector assembly;
   at least one heating lamp secured to said heat lamp mounting assemblies adjacent the reflector assembly; and
   block gates mounted on the heat lamp mounting assemblies to direct cooling across said at least one heating lamp; and
   at least one heating lamp secured to said heat lamp mounting assemblies adjacent the reflector assembly.

16. The heating lamp assembly according to claim 15, wherein said reflector assembly includes a plurality of cooling tubes brazed together to allow water to pass through the tubes cooling the reflector assembly.

17. The heating lamp assembly according to claim 16, wherein the plurality of tubes are brazed together with spacers in between the tubes.

18. The heating lamp assembly according to claim 17, wherein said heating lamp assembly has a reflecting surface, and said spacers are solid metal to conduct heat from the reflecting surface to the cooling tubes.

19. The heating lamp assembly according to claim 16, including solid metal support structure supporting the reflector assembly and is brazed thereto to provide a maximum transfer of heat form the support structure to the cooling tubes.

* * * * *